(12) United States Patent
Bouchoms

(10) Patent No.: US 10,156,791 B2
(45) Date of Patent: Dec. 18, 2018

(54) LITHOGRAPHIC APPARATUS AND METHOD

(71) Applicant: ASML Netherlands B.V., Veldhoven (NL)

(72) Inventor: Igor Petrus Maria Bouchoms, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/742,172

(22) PCT Filed: Jun. 14, 2016

(86) PCT No.: PCT/EP2016/063600
§ 371 (c)(1),
(2) Date: Jan. 5, 2018

(87) PCT Pub. No.: WO2017/012782
PCT Pub. Date: Jan. 26, 2017

(65) Prior Publication Data
US 2018/0196351 A1  Jul. 12, 2018

(30) Foreign Application Priority Data

Jul. 17, 2015  (EP) .................................... 15177197

(51) Int. Cl.
*G03F 7/20*  (2006.01)
(52) U.S. Cl.
CPC .......... *G03F 7/70083* (2013.01); *G03F 7/703* (2013.01); *G03F 7/7055* (2013.01);
(Continued)

(58) Field of Classification Search
CPC ............ G03F 7/70083; G03F 7/70091; G03F 7/70191; G03F 7/703; G03F 7/7055; G03F 7/70633; G03F 7/70783; G03F 7/7085
(Continued)

(56) References Cited

U.S. PATENT DOCUMENTS 9,835,955 B2  12/2017 Liu
2004/0185662 A1 * 9/2004 Fujisawa .............. G01B 11/306
                                                            438/689
(Continued)

FOREIGN PATENT DOCUMENTS

TW        2013-12286 A1    3/2013

OTHER PUBLICATIONS

International Search Report and Written Opinion of the International Searching Authority Directed at related International Patent Application No. PCT/EP2016/063600, dated Oct. 28, 2016; 10 pages.

(Continued)

*Primary Examiner* — Colin Kreutzer
(74) *Attorney, Agent, or Firm* — Sterne, Kessler, Goldstein & Fox P.L.L.C.

(57) ABSTRACT

A lithography method comprises: providing a substrate with a target region; determining a topology of the substrate within the target region; determining a correcting telecentricity profile based on the topology of the substrate within the target region; providing a radiation beam; and projecting the radiation beam onto the target region of the substrate so as to form an image on the substrate. The radiation beam is such that a net direction of the total radiation received by one or more points in the target region of the substrate is chosen in dependence on the determined correcting telecentricity. The correcting telecentricity profile is such that the net (Continued)

direction of the total radiation received by at least one point in the target region of the substrate is chosen so as to at least partially correct for an overlay error introduced by a curvature of a surface of the substrate at said point.

20 Claims, 8 Drawing Sheets

(52) U.S. Cl.
CPC ........ *G03F 7/7085* (2013.01); *G03F 7/70091* (2013.01); *G03F 7/70191* (2013.01); *G03F 7/70633* (2013.01); *G03F 7/70783* (2013.01)

(58) Field of Classification Search
USPC .............................................. 355/67, 68, 77
See application file for complete search history.

(56) References Cited

U.S. PATENT DOCUMENTS

| | | | |
|---|---|---|---|
| 2006/0114436 A1* | 6/2006 | Oesterholt | G03F 7/707 355/55 |
| 2006/0139608 A1 | 6/2006 | Wiener et al. | |
| 2007/0212856 A1 | 9/2007 | Owen | |
| 2008/0239258 A1 | 10/2008 | Hult | |
| 2010/0302525 A1 | 12/2010 | Zimmerman et al. | |
| 2011/0017926 A1 | 1/2011 | Lee et al. | |
| 2011/0181858 A1 | 7/2011 | Muramatsu | |
| 2012/0262685 A1 | 10/2012 | Zimmerman | |

OTHER PUBLICATIONS

International Preliminary Report on Patentability directed at related International Patent Application No. PCT/EP2016/063600, dated Jan. 23, 2018; 7 pages.

Kim et al., "Pattern Deformation Induced from Intensity-Unbalanced Off-Axis Illumination," Optical Microlithography X, SPIE, vol. 3051, Jul. 7, 1997; pp. 54-65.

Sato et al., "Measurement of effective source shift using a grating-pinhole mask," Optical Microlithography XII, SPIE, vol. 3679, Mar. 1999; pp. 99-107.

* cited by examiner

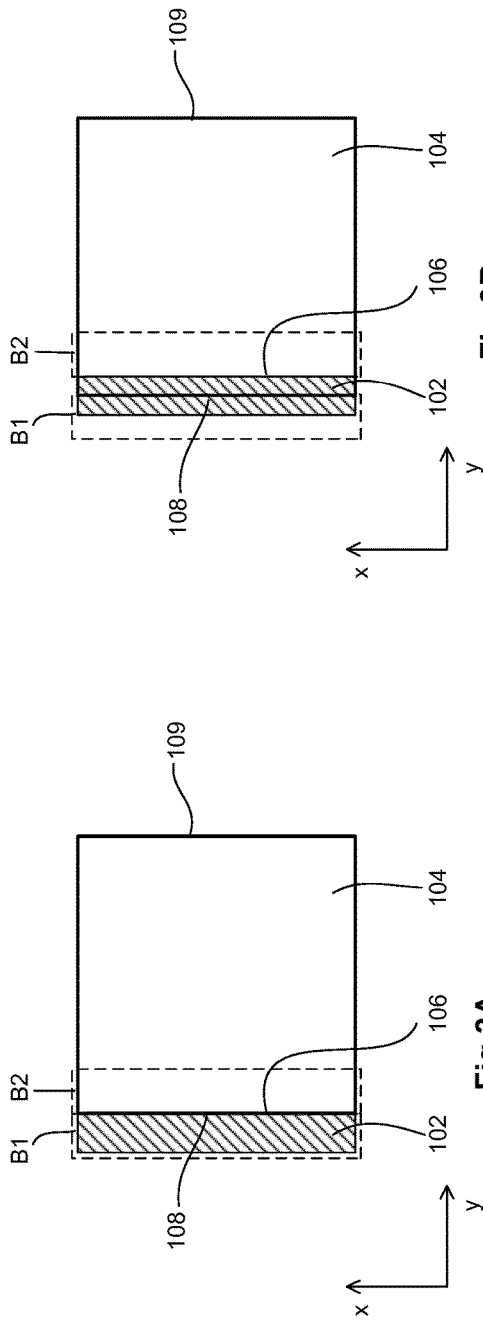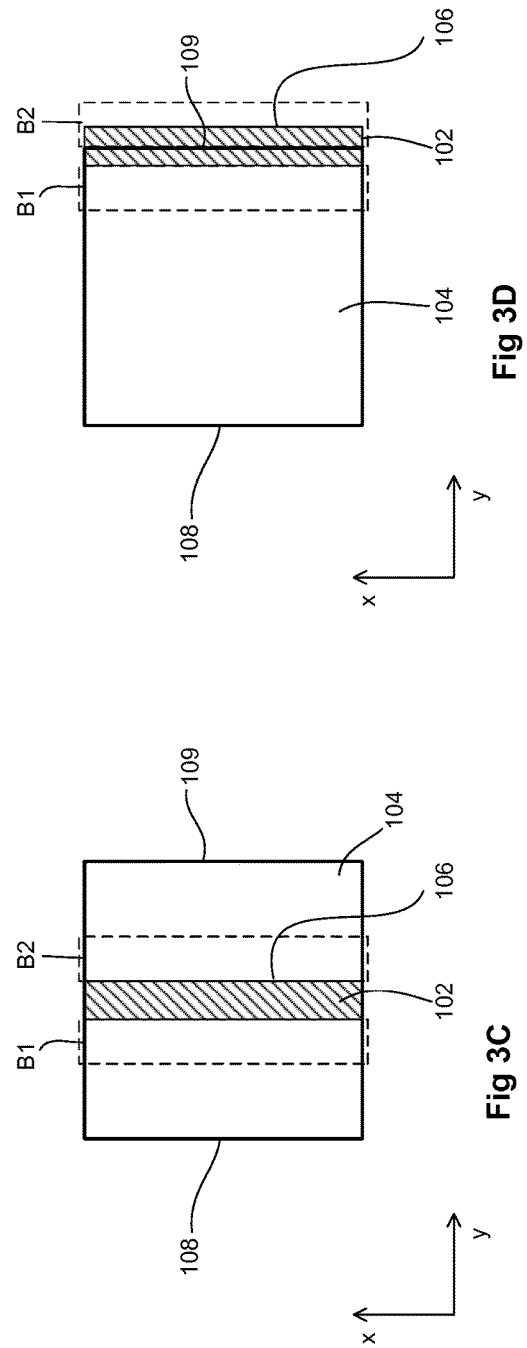

LITHOGRAPHIC APPARATUS AND METHOD

CROSS-REFERENCE TO RELATED APPLICATIONS

This application claims priority of EP application 15177197.9 which was filed on 17 Jul. 2015 and which is incorporated herein its entirety by reference.

FIELD

The present invention relates to a lithographic apparatus and a device manufacturing method. In particular, it relates to a scanning lithographic apparatus.

BACKGROUND

A lithographic apparatus is a machine that applies a desired pattern onto a target region of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target region (e.g. comprising part of, one or several dies) on a substrate (e.g. a silicon wafer) that has a layer of radiation-sensitive material (resist). In general, a single substrate will contain a network of adjacent target regions that are successively exposed. Known lithographic apparatus include so-called steppers, in which each target region is irradiated by exposing an entire pattern onto the target region in one go, and so-called scanners, in which each target region is irradiated by scanning the pattern through the beam in a given direction (the "scanning"-direction) while synchronously scanning the substrate parallel or anti parallel to this direction.

It is desirable to provide, a lithographic apparatus that obviates or mitigates one or more of the problems of the prior art, whether identified herein or elsewhere.

SUMMARY

According to a first aspect of the invention, there is provided a lithography method comprising: providing a substrate with a target region; determining a topology of the substrate within the target region; providing a radiation beam; and projecting the radiation beam onto the target region of the substrate so as to form an image on the substrate; wherein the radiation beam provided is such that a net direction of the total radiation received by one or more points in the target region of the substrate is chosen in dependence on the determined topology of the substrate so as to at least partially correct for an overlay error introduced by a curvature of a surface of the substrate at said point.

It will be appreciated that the expression "to at least partially correct for an overlay error introduced by a curvature of a surface of the substrate at said point" is intended to mean to at least reduce an overlay error that would otherwise be introduced by a curvature of the surface if, for example, the one or more points were illuminated telecentrically (i.e. such that the net direction of the total radiation received by the one or more points in the target region was perpendicular to a plane of the substrate).

It will be appreciated that the term "an overlay error" is intended to mean a difference between a position on the surface of the substrate that a part of an image is formed and a position on the surface of the substrate where it was desired to form that part of the image.

For lithography, it is desirable for the surface of the substrate to be flat and to coincide with a focal plane of a projection system that is used to project the radiation beam onto the target region of the substrate so as to form the image. However, in general the surface of the substrate may be warped, i.e. the surface is not perfectly flat. Any deviations from flatness of the surface of the substrate will in general have two effects: (a) it may cause the image formed on the substrate to be out of focus; and (b) it may cause each image point to be shifted on the surface of the substrate (which may be referred to as an overlay error). In conventional lithography methods, the substrate is typically illuminated telecentrically, i.e. such that the net direction of the total radiation received by each point in the target region of the substrate is substantially perpendicular to a plane of the substrate (which may coincide with the focal plane of the projection system). The method of the first aspect of the invention involves controlling the net direction of the total radiation received by one or more points on the substrate during the exposure process to at least partially correct for overlay errors caused by a curvature of a surface of the substrate.

To achieve this, the net direction of the total radiation received by at least one point in the target region of the substrate may be chosen such that it will result in a compensating offset error such that the total overlay error is substantially zero, or at least less than it would be if that point had been illuminated telecentrically.

It will be appreciated that each point in the target region receives radiation from a range of angles and may therefore be considered to receive a plurality of contributions, each contribution defined by a different element of solid angle and having a constant direction vector. The net direction of the total radiation received by a point in the target region of the substrate may be defined as a vector sum of the direction vectors of each contribution to that point, the sum being weighted by the energy received by each such contribution. For a scanning exposure, wherein the target region is moved relative to the radiation beam during exposure, the net direction for a given point on the substrate will be given by the slit integrated angular distribution of radiation. That is, the sum of the net directions for each point across the exposure slit, weighted by the spatial intensity profile of the slit.

The net direction of the total radiation received by at least one point in the target region of the substrate may be chosen so that the radiation which is incident on said point passes through a corresponding point in a focal plane of a projection system that is used to project the radiation beam onto the target region of the substrate so as to form the image, the corresponding point in the focal plane being the point in the focal plane where the point on the substrate would be disposed if the surface of the substrate was deformed such that it was flat and coincided with the focal plane.

The surface of the substrate may be curved such that it does not lie in the focal plane of the projection system. The curvature is such that each point on the surface of the substrate is in general displaced from a corresponding point in the focal plane where it would ideally be disposed (if the surface was flat and coincided with the focal plane). This displacement is, in general, both in a direction perpendicular to the focal plane and a plane parallel to the focal plane. Therefore, in order for the radiation that is incident on a given point on the substrate to pass through its corresponding point in the focal plane, in general the substrate may be illuminated non-telecentrically.

The net direction of the total radiation received by at least one point in the target region may be not perpendicular to the plane of the substrate. Such a method may be used to correct for overlay errors at points on the substrate which are not in a focal plane of the projection system.

The step of providing a beam of radiation may be achieved using an illumination system which comprises an intensity adjustor operable to attenuate the radiation beam on opposing sides of the radiation beam.

The intensity adjustor may comprise a plurality of movable fingers arranged in pairs, each pair comprising one finger on each side of the radiation beam. The net direction of the total radiation received by each point on the surface of the substrate may be controlled by controlling the fingers of the intensity adjustor during exposure of those points.

The net direction of the total radiation received by each point on the surface of the substrate may vary across the exposure region. In general, the net direction of the total radiation received by each point on a target region may be different.

The method may further comprise determining a correcting telecentricity profile based on the determined topology of the substrate within the target region, the correcting telecentricity profile describing the variation in the net direction of the total radiation received by points across the target region. The radiation beam provided may be such that the net direction of the total radiation received by one or more points in the target region of the substrate is chosen in dependence on the determined correcting telecentricity.

The step of projecting the radiation beam onto the target region of the substrate so as to form an image on the substrate may comprise moving the substrate along a scanning path relative to the radiation beam such that the radiation beam scans across the target region so as to form the image. The scanning path may be linear and may extend along a scanning direction.

The net direction of the total radiation received by each point on the surface of the substrate may vary across the target region in a non-scanning direction. This can be achieved, for example, by varying the extent to which each pair of fingers is inserted.

Additionally or alternatively, the net direction of the total radiation received by each point on the surface of the substrate may vary across the target region in the scanning direction. This can be achieved, for example, by varying the extent to which a pair of fingers is inserted during exposure of a target region.

The method may further comprise providing a patterning device for imparting the radiation beam with a pattern in its cross-section prior to projecting the radiation beam onto the target region of the substrate.

The step of projecting the radiation beam onto the target region of the substrate so as to form an image on the substrate may comprise moving the patterning device along a scanning path relative to the radiation beam such that the radiation beam scans across the patterning device.

The substrate may comprise a plurality of target regions. The step of determining a topology of the substrate within the target region may comprise determining a topology of the substrate within each of the plurality of target regions. The step of projecting the radiation beam onto the target region of the substrate so as to form an image on the substrate may comprise sequentially projecting the radiation beam onto each target region of the substrate so as to form an image. In general, each target region may have its own correcting telecentricity profile. For example, a target region towards the centre of the substrate may in general have a different correcting telecentricity profile to a target region towards the edge of a substrate (e.g. nearer to a clamp).

The step of determining a topology of the substrate within a target region may be performed before the substrate is clamped to a substrate table. The step of determining a topology of the substrate within a target region may further comprise modelling the effects of clamping the substrate to a substrate table on the topology of the substrate.

Alternatively, the step of determining a topology of the substrate within a target region may be performed after the substrate has been clamped to a substrate table.

The step of determining a topology of the substrate within a target region may comprise determining a height of the substrate at a plurality of points on the surface of the substrate.

The method may comprise: projecting a radiation beam onto the plurality of points on the surface of the substrate, detecting radiation reflected from the substrate and determining a height of the substrate from the detected reflected radiation.

According to a second aspect of the invention there is provided a lithographic apparatus comprising: an illumination system for conditioning a radiation beam; a substrate table for holding a substrate; a projection system for projecting the patterned radiation beam onto a target region of the substrate so as to form an image on the substrate; and a controller operable to control a net direction of the total radiation received by one or more points in the target region of the substrate such that the net direction of the total radiation received by at least one point in the target region of the substrate is chosen so as to at least partially correct for an overlay error introduced by a curvature of a surface of the substrate at said point.

The controller may be operable to implement one or more steps of the method of the first aspect of the invention.

The controller may comprise a processor operable to determine a correcting telecentricity based on a topology of the substrate within the target region.

The illumination system may comprise an intensity adjustor operable to attenuate the radiation beam on opposing sides of the radiation beam.

The intensity adjustor may comprise a plurality of movable fingers arranged in pairs, each pair comprising one finger on each side of the radiation beam such that the net direction of the total radiation received by each point on the surface of the substrate may be controlled by controlling a position of the fingers of the intensity adjustor during exposure of those points.

The lithographic apparatus may further comprise a scanning mechanism operable to move the substrate table along a scanning path relative to the radiation beam such that the radiation beam scans across the target region so as to form the image.

The lithographic apparatus may further comprise a support structure for supporting a patterning device and the radiation beam conditioned by the illumination system may be directed to the support structure so that a patterning device supported by the support structure can impart a pattern in the cross-section of the radiation beam, forming a patterned radiation beam which is projected onto the target region.

The lithographic apparatus may further comprise a topography measurement system operable to determine a height of a substrate on the substrate table at a plurality of points on the surface of the substrate.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3A-3D illustrate the position of a band of radiation projected onto a target region of a substrate by the lithographic apparatus of FIG. 1 and the positions of two masking blades during a dynamic exposure process;

FIG. 6A represents telecentric illumination of the upper surface and FIG. 6B represents non-telecentric illumination of the upper surface;

FIG. 7A represents telecentric illumination of the upper surface and FIG. 7B represents non-telecentric illumination of the upper surface wherein the net direction of the total radiation received by one or more points on the upper surface at least partially corrects for an overlay error introduced by the curvature of the upper surface at those points.

DETAILED DESCRIPTION

Figure 1B:
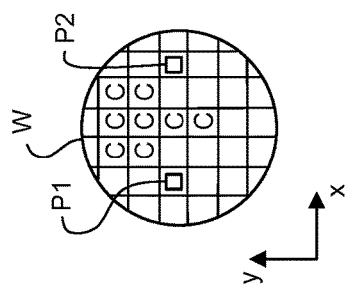
FIGS. 1A-1C depict a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target region", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target region of the substrate. It should be noted that the pattern imparted to the radiation beam may not exactly correspond to the desired pattern in the target region of the substrate. Generally, the pattern imparted to the radiation beam will correspond to a particular functional layer in a device being created in the target region, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. In particular, it holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1C:
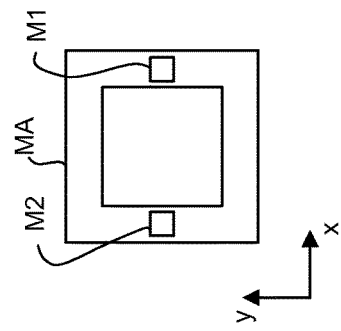
Figure 1A:
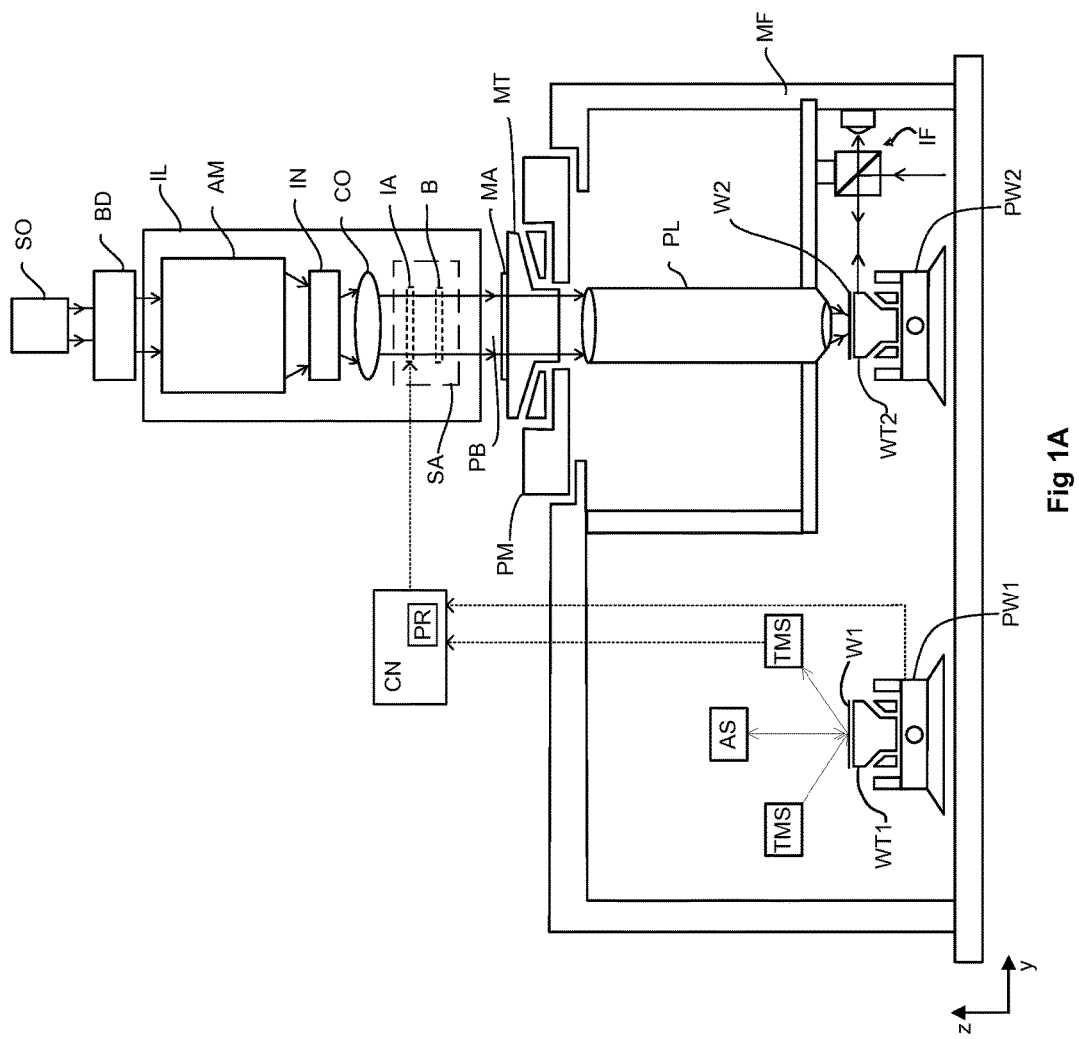

FIG. 1A schematically depicts a lithographic apparatus according to a particular embodiment of the invention. The apparatus comprises:

an illumination system (illuminator) IL for conditioning a beam PB of radiation (e.g. UV radiation or DUV radiation);
a frame MF;
a support structure (e.g. a mask table) MT to support a patterning device (e.g. a mask) MA;
two substrate tables (e.g. a wafer table) WT1, WT2, each for holding a substrate (e.g. a resist coated wafer) W1, W2 respectively; and
a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move the substrate table WT2 along a scanning path relative to the radiation beam such that the radiation beam scans across a target region C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS and topography measurement system TMS (as will be described more fully below) prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table with is at that time disposed on the left and substrate table WT2 will generally refer to the substrate table with is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multipole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target region C that can be exposed in a single dynamic exposure. In contrast, the extent in the scanning direction of the target region C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. This plane may be stationary with respect to the frame MF. The terms "slit profile", "profile of the radiation beam", "intensity profile" and "profile" may be used interchangeably to refer to the shape of the (spatial) intensity distribution of the slit, especially in the scanning direction. In a plane perpendicular to an optical axis of the lithographic apparatus, an exposure region may refer to a region of the plane which can receive radiation.

The illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it partially blocks the radiation beam PB. The masking blades are disposed in a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

Figure 2A:
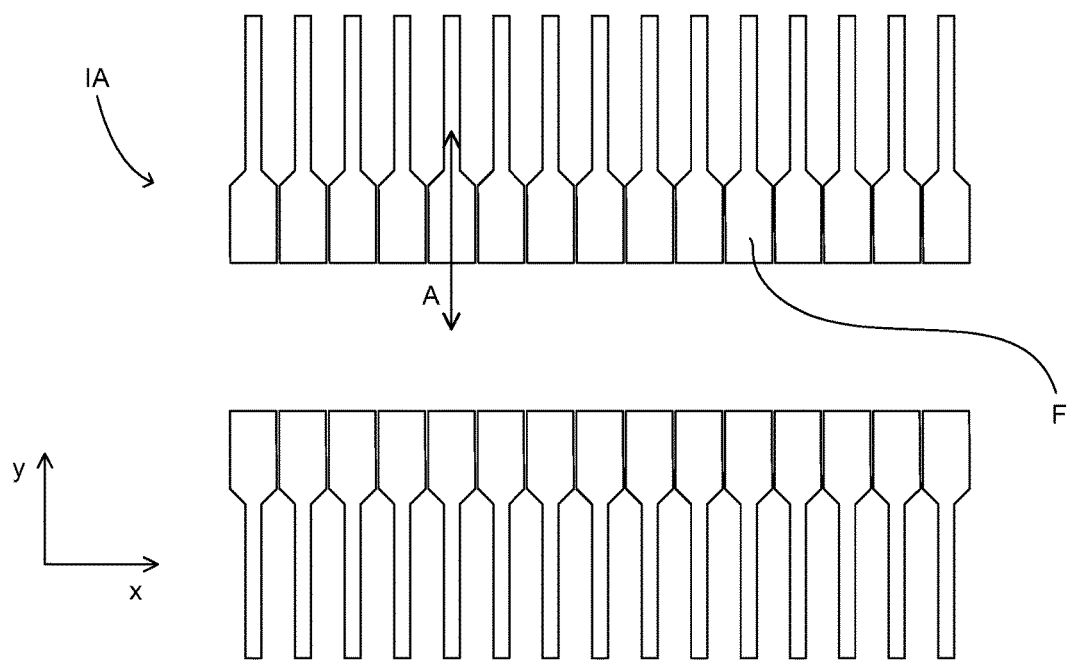
FIG. 2A is a schematic illustration of an intensity adjustor (shown in a first configuration) that forms part of the lithographic apparatus of FIG. 1.
Figure 2B:
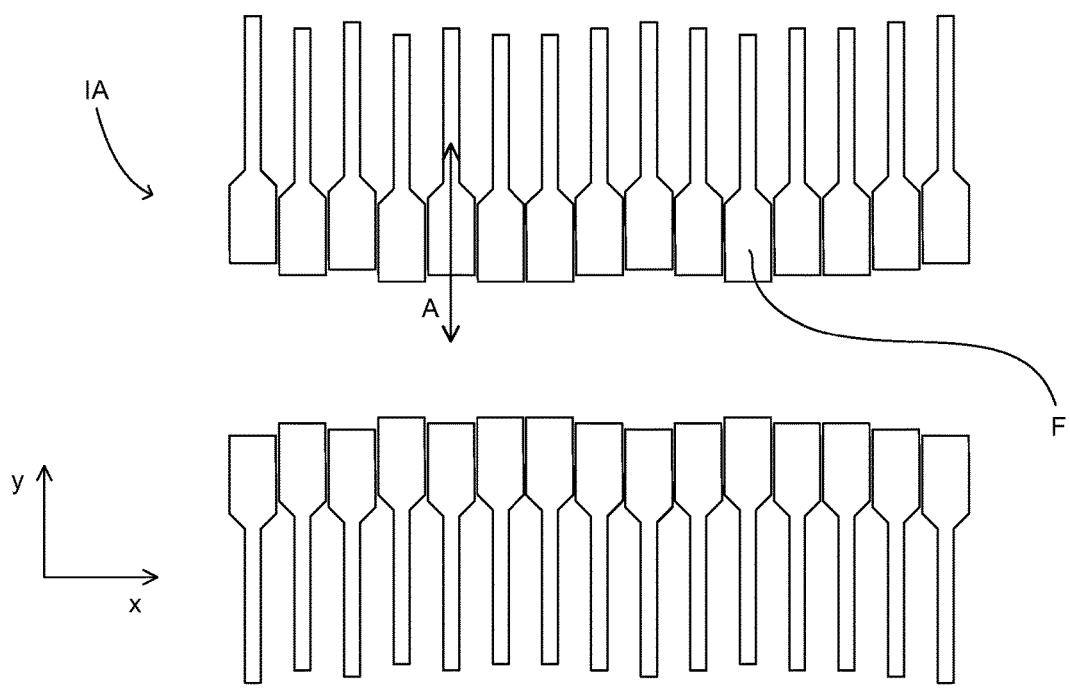
FIG. 2B is a schematic illustration of an intensity adjustor (shown in a second configuration) that forms part of the lithographic apparatus of FIG. 1.

The illuminator IL comprises an intensity adjustor IA (shown schematically in FIG. 1A). The intensity adjustor IA is operable to attenuate the radiation beam on opposing sides of the radiation beam, as now described. As shown in FIGS. 2A and 2B, the intensity adjustor IA comprises a plurality of movable fingers F, shown in two different configurations. The fingers F are arranged in pairs, each pair comprising one finger on each side of the slit (i.e. each pair of fingers F is separated in the y-direction). The pairs of fingers F are arranged along the length of the slit (i.e. extending in the x-direction). Each movable finger F is independently movable in the scanning direction (y-direction in FIGS. 2A and 2B), as indicated by arrow A for one of the fingers F in FIG. 2A. That is, the fingers F are moveable in a direction perpendicular to the length of the slit. In use, each movable finger F is independently movable in the scanning direction. For example, each movable finger F may be movable between at least a retracted position wherein it is not disposed in the path of the radiation beam and an inserted position wherein it partially blocks the radiation beam. In FIG. 2A all of the fingers on each side of the slide are shown disposed at the same y position. As shown in FIG. 2B, in general the fingers on a given side of the slit may be disposed at different y positions. By moving the fingers F, the shape and/or the intensity distribution of the slit can be adjusted.

The fingers F may not be in a field plane of the lithographic apparatus and the field may be in the penumbra of the fingers such that the fingers do not sharply cut off the radiation beam PB. The pairs of fingers may be used to apply a different level of attenuation of the radiation beam PB along the length of the slit.

The intensity function of the radiation beam PB may vary across the width of the slit, which may correspond to a scanning direction. The shape of the intensity function across the width of the slit may be referred to as a profile of the radiation beam PB (or slit profile). The profile of the radiation beam PB may be substantially the same along the length of the slit. Additionally or alternatively, the integral of the intensity profile of the radiation beam PB across the width of the slit may be substantially constant along the length of the slit. This may be achieved by inserting the pairs of fingers into the path of the radiation beam PB by different amounts so as to attenuate the radiation beam by different amounts along the length of the slit, as schematically illustrated in FIG. 2B. For such embodiments, where the pairs of fingers are inserted into the path of the radiation beam PB by different amounts, the profile of the radiation beam PB will vary slightly along the length of the slit.

The illuminator IL provides a conditioned beam of radiation PB, having a desired uniformity and intensity distribution in its cross section. The fingers F and the masking blades B may be considered to define a slit aperture SA of the illuminator IL through which the conditioned beam of radiation PB exits the illuminator IL.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT relative to the beam of radiation PB that has been conditioned by the illuminator IL along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor α to the radiation beam PB then the distance travelled by each conjugate point in a given time period will be less than that travelled by the corresponding point on the patterning device by a factor of α. Therefore the magnitude of the velocity $|v_{WT}|$ of the substrate table WT2 should be $|v_{MT}|/\alpha$.

The illuminator IL illuminates an exposure region of the patterning device MA with radiation beam PB and the projection system PL focuses the radiation at an exposure region in a plane of the substrate W. The masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus. As example of how the masking blades are used is now described with reference to FIG. 3.

FIG. 3 illustrates the positions of two masking blades B1, B2 at different stages during the exposure of a target region 104 of a substrate W. Target region 104 may, for example, be any one of the target regions C illustrated in FIG. 1B.

As shown in FIG. 3A, at the start of a single dynamic exposure of the target region 104, the exposure region 102 in the plane of the substrate W (i.e. the portion of the substrate that the slit is projected onto by projection system PL) is adjacent to the target region 104. The extent of the exposure region 102 in the non-scanning direction (x-direction) is substantially the same as that of the target region 104 and the exposure region 102 is aligned with the target region 104 in the non-scanning direction (x-direction). The extent of the exposure region 102 in the scanning direction (y-direction) may be different from that of the target region 104. In the scanning direction (y-direction) the exposure region 102 is adjacent to the target region 104 such that the exposure region 102 neither overlaps nor is spaced apart from the target region 104 (i.e. a leading edge 106 of the exposure region 102 substantially coincides with an edge of the target region 104).

In FIG. 3, projections of the two masking blades B1, B2 onto the plane of the substrate W are shown as dashed lines. At the start of the dynamic exposure of target region 104 (with the target region 104 disposed as shown in FIG. 3A) a first one of the masking blades B1 of the slit is disposed in the path of the radiation beam, acting as a shutter, such that no part of the substrate W receives radiation. This ensures that an adjacent target region is not exposed to radiation.

As a leading edge 108 of the target region 104 of the substrate W that is being exposed moves into the exposure region 102, the first masking blade B1 moves such that only the target region 104 receives radiation (i.e. no parts of the substrate outside of the target region 104 are exposed). That is, the masking blade B1 is disposed such that only the overlap between the exposure region 102 and the target region 104 receives radiation, as shown in FIG. 3B.

As shown in FIG. 3C, midway through the exposure of the target region 104 both masking blades B1, B2 are retracted out of the path of the radiation beam such that the entire exposure region 102 receives radiation. As the target region 104 of the substrate W moves out of the exposure region (i.e. a trailing edge 109 of the target region 104 passes the leading edge 106 of the exposure region 102), a second one of the masking blades B2 moves such that only the portion of the target region 104 that is disposed in the exposure region 102 receives radiation. This is illustrated in FIG. 3D.

The exposure region of the patterning device MA and the exposure region in a plane of the substrate W may be defined by the slit of radiation when the masking blades of the illuminator are not disposed in the path of the radiation beam PB.

Using the scan mode, the lithographic apparatus is operable to expose a target region C of the substrate W with substantially fixed area to radiation. For example, the target region C may comprise part of, one or several dies. A single wafer may be exposed to radiation in a plurality of steps, each step involving the exposure of a target region C followed by a movement of the substrate W. After exposure of a first target region C, the lithographic apparatus may be operable to move the substrate W relative to the projection system PL so that another target region C can be exposed to radiation. For example, between exposures of two different target regions C on the substrate W, the substrate table WT2 may be operable to move the substrate W so as to position the next target region so that it is ready to be scanned through the exposure region. This may be achieved, for example, by moving the substrate W so that the next target region is disposed adjacent to the exposure region 102.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1, as described further below. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto).

During exposure of a substrate, each point on the substrate will in general receive radiation from a range of angles. The angular distribution of energy received by a given point in the exposure slit may be referred to as the pupil fill for that point. The pupil fill is determined by the illumination mode produced by the illuminator IL, i.e. the intensity distribution of the radiation beam in a pupil plane of the illuminator IL, and the slit aperture SA of the illuminator IL (defined by the fingers F and the masking blades B) through which the conditioned beam of radiation PB exits the illuminator IL. In general, each point on in the exposure slit may have a different pupil fill.

Figure 4B:
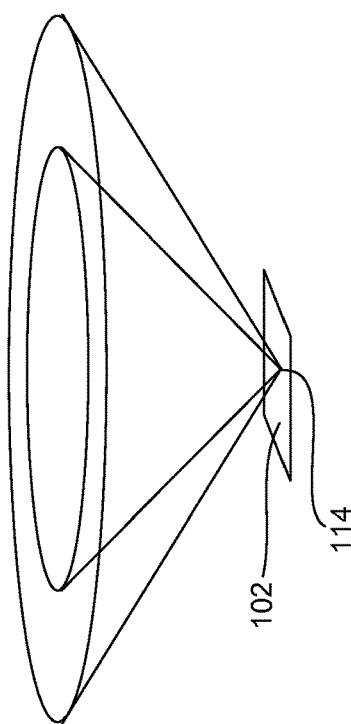
FIG. 4B illustrates the instantaneous angular distribution of radiation received by a point within an exposure region (in a field plane of the lithographic apparatus) using the illumination mode illustrated in FIG. 4A.
Figure 4A:
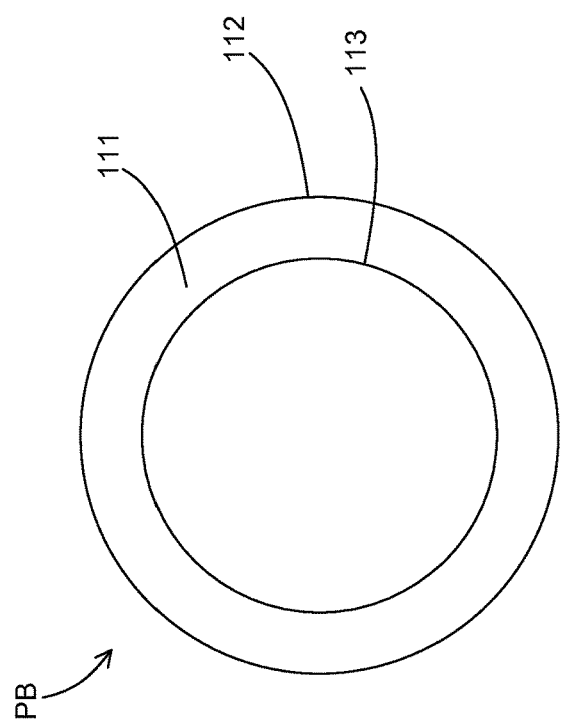
FIG. 4A illustrates an annular illumination mode of a radiation beam in a pupil plane of the illuminator of the lithographic apparatus of FIG. 1.

The pupil fill for a point in a central portion of the exposure slit is now discussed with reference to FIG. 4. FIG. 4A illustrates radiation beam PB in a pupil plane of the illuminator IL wherein the intensity distribution is non-zero within an annular region 111, defined by σ-outer 112 and σ-inner 113. In this example, the intensity of the radiation beam PB is uniform within the annular region 111. FIG. 4B illustrates the instantaneous angular distribution of radiation received by a point 114 within the exposure region 102 (in a field plane of the lithographic apparatus) using the illumination mode illustrated in FIG. 4A. The field plane may for example be the plane of the masking blades, the plane of the patterning device MA or the plane of the substrate W. Note that in the example shown, the point 114 is in a central region of the exposure region 102 and therefore its pupil fill is not affected by the slit aperture SA of the illuminator IL (assuming that the masking blades B are not disposed in the path of the radiation beam PB).

Each point in the exposure region 102 receives radiation from a range of angles and may be considered to receive a plurality of contributions, each contribution defined by a different element of solid angle and having a constant direction vector. A net direction may be defined for the instantaneous radiation received by a given point (for example point 114). This net direction may be a defined as a vector sum of the direction vectors of each contribution of radiation to that point, the sum being weighted by the energy received by each such contribution. For the symmetric illumination mode shown in FIG. 4A, the net direction of the instantaneous radiation received by a given point in the central region of the exposure region 102 (for example point 114) is perpendicular to the plane of the substrate.

Figure 5:
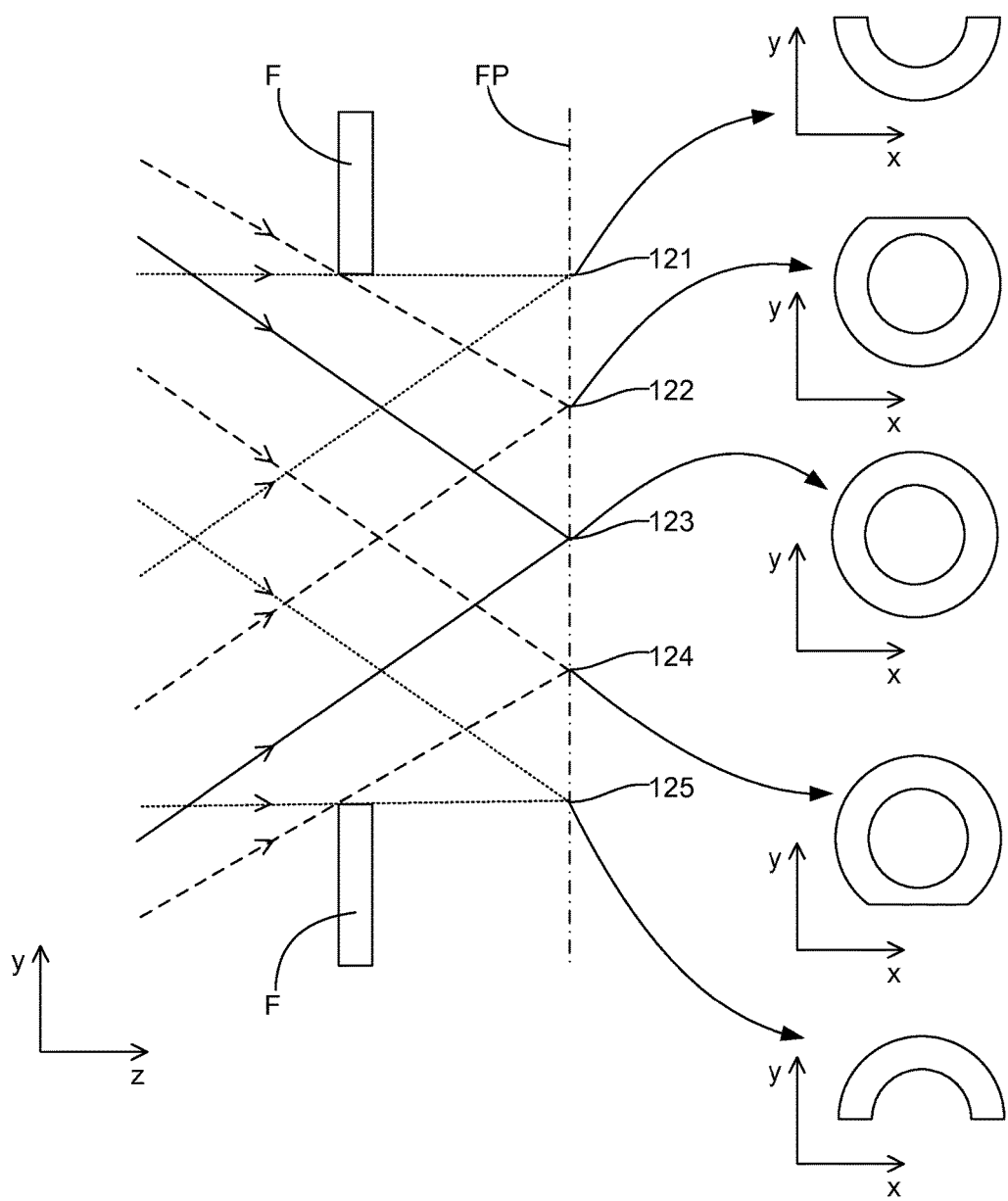
FIG. 5 shows a schematic cross sectional view of the intensity adjustor shown in FIGS. 2A and 2B, showing a single pair of fingers and the pupil fill for five different points in a field plane of the lithographic apparatus for an annular illumination mode as shown in FIG. 4.

The pupil fill of points in the exposure region 102 which are not disposed in the central region will in general be affected by the slit aperture SA, as now described with reference to FIG. 5. FIG. 5 shows a schematic cross sectional view of the intensity adjustor IA in a plane containing the optical axis of the lithographic apparatus (z direction) and the scanning direction (y direction), showing a single pair of fingers F. Also illustrated is the angular distribution of radiation received by five different points 121-125 in a field plane FP of the lithographic apparatus. Field plane FP may, for example, be the plane of the masking blades B described above.

The pupil fill for each of the five points 121-125 is also illustrated in FIG. 5, assuming that the illuminator IL produces the annular illumination mode described above with reference to FIG. 4. The pupil fill of centre point 123, which is disposed in the centre of the field (in the scanning direction) is given by the annular illumination mode. Two edge points 121, 125 represent two opposite sides of the field (in the scanning direction), where the angular distribution of radiation received is limited by one of the two fingers F. As a result, each of the two edge points 121, 125 only receives half of the light cone shown in FIG. 4B and the pupil fill may be represented by a semi-annular region in the x-y plane. Also shown are two intermediate points 122, 124, each of which is disposed between the centre of the field and one of the two sides of the field. The angular distribution of radiation received by intermediate points 122, 124 is also limited by one of the two fingers F but to a lesser extent than the two end points 121, 125. As a result, the pupil fill of each of the two intermediate points 122, 124 may be represented by a truncated annular region in the x-y plane.

As explained above, during exposure of a substrate W, both the patterning device MA and the substrate W are scanned through the exposure region. As a given point on the substrate W scans across the exposure region, it will move through a range of points in exposure slit the scanning direction, including points 121-125 discussed above. At the beginning of the scan for a given point, it will preferentially receive radiation from one direction (e.g. at point 121) because a first one of the fingers F will partially shield it from the radiation beam. At the end of the scan for a given point, it will preferentially receive radiation from the opposite direction (e.g. at point 125) because an opposite one of the fingers F will partially shield it from the radiation beam. In the centre of scan (e.g. at point 123) the radiation received by the given point is dependent on the illumination mode of the illuminator IL. For a symmetric illumination mode, the net direction of the instantaneous radiation received by a given point in the centre of scan (e.g. at point 123) may be perpendicular to the plane of the substrate.

Just as the net direction was defined above for the instantaneous radiation received by a given point in the exposure region, it is also possible to define a net direction of the total radiation received by a given point on the substrate during the exposure process. This net direction may be a defined as a vector sum of the direction vectors of each contribution to that point, the sum being weighted by the energy received by each such contribution. The net direction for a given point on the substrate W will be given by the slit integrated angular distribution of radiation. That is, the sum of the net directions for each point across the exposure slit, weighted by the spatial intensity profile of the slit. For the symmetric illumination mode shown in FIG. 4A, and a symmetric slit profile, the net direction of the total radiation received by a given point on the substrate during the exposure process is perpendicular to the plane of the substrate W. This may be referred to as telecentric illumination of the substrate W.

It will be appreciated that the substrate W may not be perfectly flat but rather may be warped. For such substrates, the plane of the substrate may be a plane which represents an average plane representative of a surface of the substrate W. The plane of the substrate W may be parallel to, or may coincide with, a focal plane of the projection system PL.

Note that, in a similar way to the fingers F, the masking blades B1, B2 (see FIG. 4) will partially shield parts of the substrate W from the radiation beam towards the beginning and the end of the exposure of a given target region C.

During exposure of a substrate W, it is desirable for the substrate W to be disposed in the focal plane of the projection system PL such that a sharp image of the patterning device MA is formed on the surface of the substrate W. If the substrate lies out of the focal plane then the image formed will not be as sharp. Furthermore, if that point is not illuminated telecentrically (i.e. the net direction of the total radiation received by that point during the exposure process is not perpendicular to the plane of the substrate W) then because the substrate W is out of focus, the image will also be shifted in the plane of the substrate W, as now described.

In the lithographic apparatus of FIG. 1A, during exposure of a substrate W to radiation from the projection system PL, the substrate W is substantially horizontal and the image formed on the substrate W is formed on its upper surface. It will be appreciated that in some embodiments, the substrate W may not be substantially horizontal during the exposure process. However, it will be understood that in the following the upper surface of a substrate W refers to a surface of that substrate W upon which the image is formed.

Figure 6A:
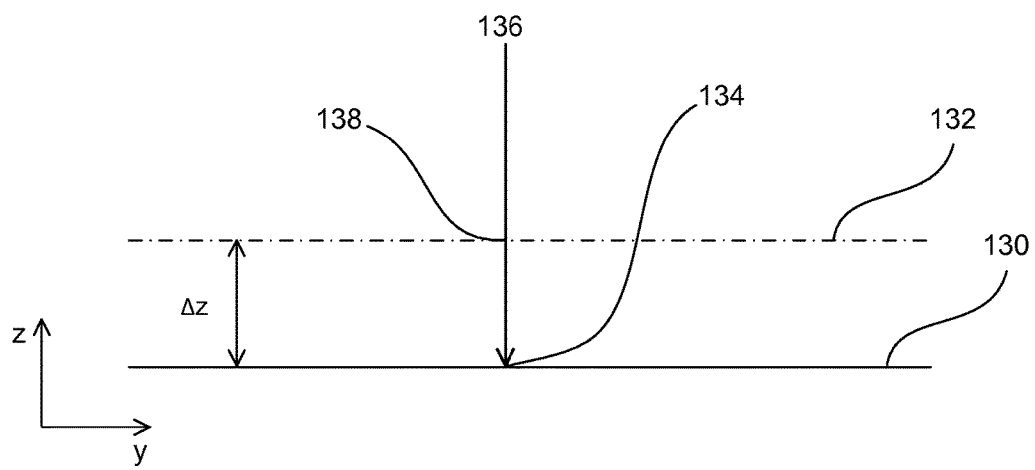
FIGS. 6A and 6B show a portion of an upper surface of a substrate in cross section and a focal plane of the projection system of the lithographic apparatus of FIG. 1, the upper surface being parallel to but displaced from the focal plane.
Figure 6B:
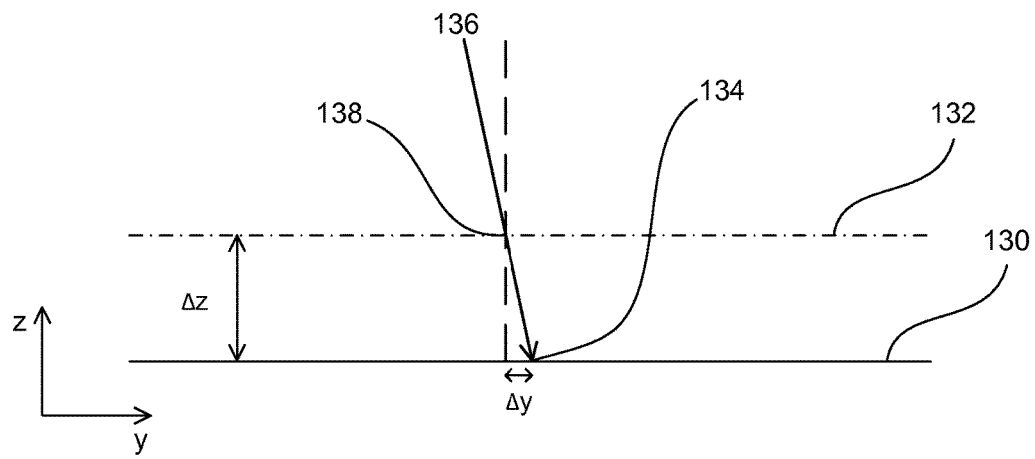

FIGS. 6A and 6B show a portion of an upper surface 130 of a substrate W in cross section and a focal plane 132 of the projection system PL. The upper surface 130 is parallel to but displaced from the focal plane 132 of the projection system PL by a defocus $\Delta z$. The projection system PL is arranged to project a pattern onto the upper surface 130 of the substrate W. In order to do this, each point on the patterning device MA is imaged onto a point in the focal plane 132 of the projection system PL. A given point on the patterning device MA may be imaged onto a first point 134 on the upper surface 130 and a second point 138 in the focal plane 132. Since the upper surface 130 of the substrate W is not in the focal plane 132, in general, the position (e.g. in the y-direction) of the first point 134 on the upper surface 130 and the second point 138 in the focal plane 132 will be different. The relative position (e.g. in the y-direction) of the first point 134 on the upper surface 130 and the second point 138 in the focal plane 132 is dependent on the net direction of the total radiation received by the first and second points 134, 138.

In FIGS. 6A and 6B the net direction of the total radiation received by the first point 134 on the upper surface 130 during the exposure process is illustrated by arrow 136.

FIG. 6A represents telecentric illumination of the upper surface 130 of the substrate W, i.e. arrow 136 is perpendicular to the upper surface 130. For such an arrangement, even though the upper surface 130 of the substrate W lies out of the focal plane of the projection system PL, the first and second points 134, 138 are disposed at the same position in a plane perpendicular to the optical axis of the projection system PL (i.e. the x-y plane).

FIG. 6B represents non-telecentric illumination of the upper surface 130 of the substrate W, i.e. arrow 136 is not perpendicular to the upper surface 130. For such an arrangement, because the upper surface 130 of the substrate W lies out of the focal plane of the projection system PL, the first point 134 on the upper surface 130 of the substrate W is shifted relative to the second point 138 in the focal plane 132 in a plane perpendicular to the optical axis of the projection system PL (i.e. the x-y plane). The size of the shift $\Delta y$ is dependent on the size of the defocus $\Delta z$ and the net direction of the total radiation received by the first point 134 on the upper surface 130 during the exposure process. The size of the shift $\Delta y$ may be referred to as an offset error.

For image quality purposes, it is desirable for the surface of the substrate W to be flat and to coincide with a focal plane of the projection system PL. However, in general the surface of the substrate W may be warped, i.e. not perfectly flat. The substrate W may be warped before being clamped to one of the substrate tables WT1, WT2. Alternatively or additionally, the substrate W may be warped as a result of being clamped to one of the substrate tables WT1, WT2. The clamping of the substrate W to one of the substrate tables WT1, WT2 may result in a deformation of the substrate W wherein the displacement of each point on the upper surface of the substrate W from a reference plane is dependent only on a radial position of that point.

Figure 7A:
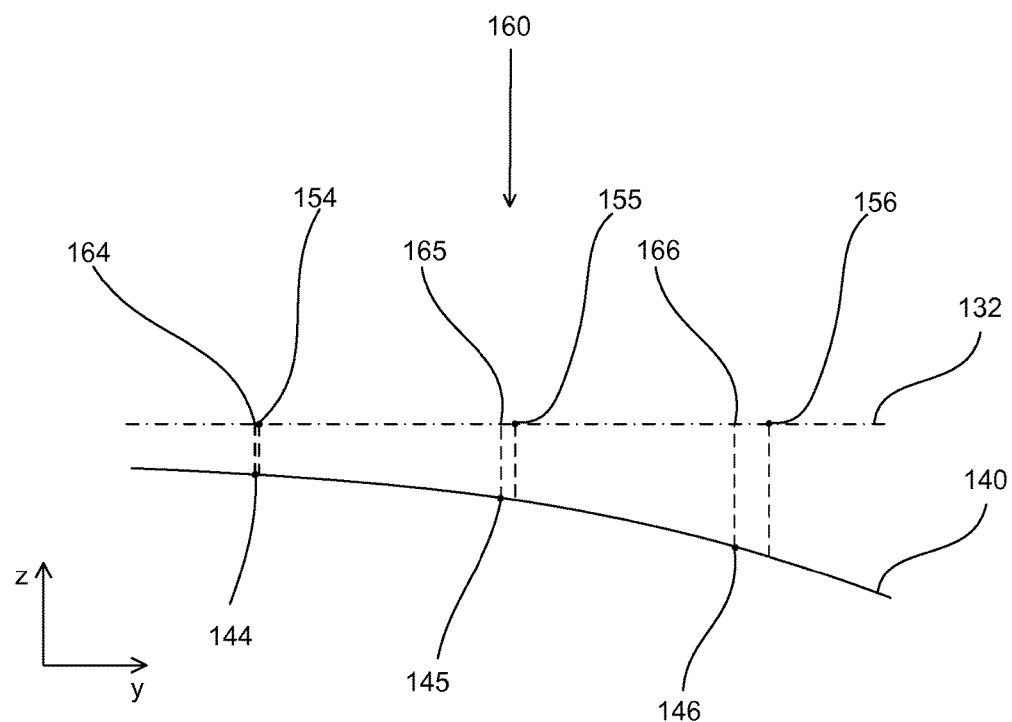
FIGS. 7A and 7B show a portion of an upper surface of a substrate in cross section and a focal plane of the projection system of the lithographic apparatus of FIG. 1, the upper surface being curved such that it does not lie in the focal plane.
Figure 7B:
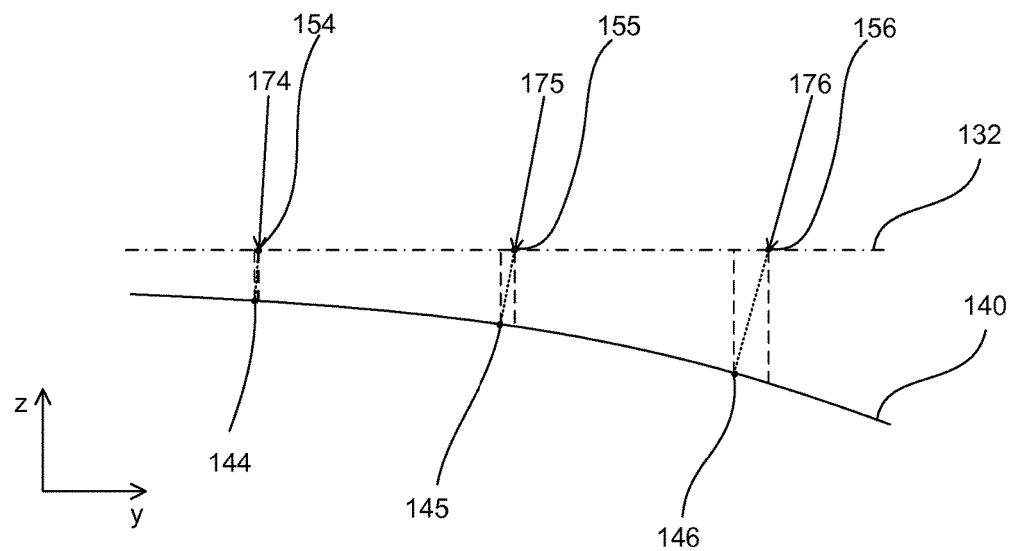

FIGS. 7A and 7B show a portion of an upper surface 140 of a substrate W in cross section and the focal plane 132 of the projection system PL. The upper surface 140 is curved such that it does not lie in the focal plane 132 of the projection system PL. The curvature is such that each point on the upper surface is in general displaced from a corresponding point in the focal plane where it would ideally be disposed (if the upper surface 140 was flat). This displacement is, in general, both in a direction perpendicular to the focal plane (i.e. the z-direction) and a plane parallel to the focal plane (i.e. the x-y plane). In this context a point on the upper surface 140 corresponds to the point in the focal plane 132 where it would be disposed if the upper surface 140 of the substrate W were deformed such that it was flat and coincided with the focal plane 132. To illustrate this, three points 144, 145, 146 on the upper surface 140 and their corresponding points 154, 155, 156 in the focal plane 132 are shown in FIGS. 7A and 7B. If the upper surface 140 of the substrate W were deformed such that it was flat and coincided with the focal plane 132 then each of the three points 144, 145, 146 on the upper surface 140 would coincide with points 154, 155, 156 respectively.

The projection system PL is arranged to project a pattern onto the upper surface 140 of the substrate W. In order to do this, each point on the patterning device MA is imaged onto a point in the focal plane 132 of the projection system PL. A given point on the patterning device MA may be imaged onto a first point on the upper surface 140 and a second point in the focal plane 132. Since the upper surface 140 of the substrate W is curved, in general, the position (e.g. in the y-direction) of the first point on the upper surface 140 and the second point in the focal plane 132 will be different.

It can be seen from FIGS. 7A and 7B that any deviations from flatness of the upper surface 140 of the substrate W will in general have two effects: (a) it may cause the image of the patterning device MA to be out of focus; and (b) it may cause each image point to be formed on a different point on the upper surface 140 of the substrate W (i.e. cause an overlay error).

Ideally, the first point on the upper surface 140 and the second point in the focal plane 132 should be corresponding points (i.e. if the upper surface 140 of the substrate W were deformed such that it was flat and coincided with the focal plane 132 the first point on the upper surface 140 and the second point in the focal plane 132 would coincide). This is dependent on: (i) the relative position (e.g. in the y and z directions) of the first point on the upper surface 140 and the second point in the focal plane 132; and (ii) the net direction of the total radiation received by the first and second points.

In FIG. 7A the net direction of the total radiation received by each point on the upper surface 140 during the exposure process is illustrated by arrow 160. FIG. 7A represents telecentric illumination of the upper surface 140 of the substrate W, i.e. arrow 160 is perpendicular to a plane of the substrate W. In this context, with the upper surface 140 being curved, the plane of the substrate W is parallel to the focal plane 132. For such a telecentric arrangement, the points on the upper surface 140 and the focal plane 132 which receive radiation from the same part of the patterning device MA are disposed at the same position in a plane perpendicular to the optical axis of the projection system PL (i.e. the x-y plane). Therefore, each of the points 144, 145, 146 on the upper surface 140 of the substrate W receives radiation that passes through a point 164, 165, 166 in the focal plane 132 which differs from its corresponding point 154, 155, 156 in the focal plane 132. Effectively, the curvature of the upper surface 140 of the substrate W has introduced an overlay error.

Embodiments of the present invention involve controlling the net direction of the total radiation received by one or more points on the substrate W during the exposure process to at least partially correct for such overlay errors. In particular, the invention may involve adjusting a net direction of the total radiation received by one or more points on the substrate W during the exposure process such that it is not perpendicular to the plane of the substrate W (i.e. the one or more points are not telecentrically illuminated). This may be used to correct for overlay errors at points on the substrate W which are not in a focal plane of the projection system PL. The net direction of the total radiation received by one or more points on the substrate W may be chosen such that it will result in a compensating overlay error such that the total overlay error is substantially zero, or at least less than it would be if that point had been illuminated telecentrically. Such a situation is illustrated in FIG. 7B.

In FIG. 7B the net direction of the total radiation received by each of the three points 144, 145, 146 on the upper surface 140 during the exposure process is illustrated by arrows 174, 175, 176 respectively. In general, net direction of the total radiation received by each of the three points 144, 145, 146 on the upper surface 140 during the exposure process may differ. The net direction of the total radiation received by each of the three points 144, 145, 146 on the upper surface 140 during the exposure process is chosen such that each of the points 144, 145, 146 on the upper surface 140 of the substrate W receives radiation that passes through its corresponding point 154, 155, 156 in the focal plane 132. Effectively, the illumination of each point 144, 145, 146 is chosen to produce an overlay error with the same size but opposite sign as the overlay error introduced by the curvature of the upper surface 140 of the substrate W. That is, if before the correction (i.e. with telecentric illumination) a point on the substrate W has an overlay error of +x nm, the net direction at which that point is illuminated is chosen so as to introduce an overlay error of −x nm. In this way overlay errors for warped substrates W can be reduced, for example at the edge of the substrate W (where the substrate W is typically deformed due to clamping forces).

The net direction of the total radiation received by each point on the upper surface of the substrate W during an exposure process is controlled by controlling the fingers F of the intensity adjustor IA during exposure of those points. For example, referring again to FIG. 2, if each pair of fingers F is inserted by the same amount into the path of the radiation beam PB, then each point on the substrate may be illuminated telecentrically (assuming a symmetric illumination mode in the pupil plane of the illuminator IL). However, by inserting the finger F one side of the slit more than the finger F on the opposite side of the slit other the pupil fill may be truncated more towards the beginning (end) of the scanning exposure of a given point than it is towards the end (beginning) of the scanning exposure of that point. As a result, that point is not telecentrically illuminated (i.e. the scan integrated pupil fill is not symmetric).

The fingers F of the intensity adjustor IA are controlled by a controller CN (see FIG. 1A). Controller CN is operable to send a signal to the intensity adjustor IA. Upon receipt of the signal, the intensity adjustor IA is operable to control the positions of each pair of fingers F.

The net direction of the total radiation received by each point on the upper surface of the substrate W may in general vary across the width of the slit. That is, the net direction of the total radiation received by two points at different non-scanning (x) positions on the upper surface of the substrate W may be different. This can be achieved by varying the extent to which each pair of fingers F is inserted. For example, a first pair of fingers F that correspond to a first point in the non-scanning direction may be inserted differently to a second pair of fingers F that correspond to a second point in the non-scanning direction.

Furthermore, the net direction of the total radiation received by each point on the upper surface of the substrate W may in general vary in the scanning direction. That is, for a given non scanning position (i.e. x position) the net direction of the total radiation received by two points at different scanning (y) positions on the upper surface of the substrate W may be different. This can be achieved by varying the extent to which a pair of fingers F is inserted during exposure of a target region C.

In general, the net direction of the total radiation received by each point on a target region C may be different. The variation in the net direction of the total radiation received by points across a target region C may be referred to as a correcting telecentricity profile. Each target region C will, in general, have its own correcting telecentricity profile. For example, a target region C towards the centre of the substrate W may in general have a different correcting telecentricity profile to a target region C towards the edge of a substrate (e.g. nearer to a clamp).

The correcting telecentricity profile for each target region C is related to the topography of the substrate W within that target region C. In some embodiments, information relating to the topology of each substrate W is used to generate a correcting telecentricity profile for each target region C of the substrate W. As described above, with reference to FIG. 7, the correcting telecentricity profile for each target region C is chosen such that the illumination of each point within the target region C produces an overlay error with the same size but opposite sign as an overlay error introduced by the topology of an upper surface of the substrate W.

The controller CN may comprise a processor PR (see FIG. 1A) which is operable to generate a correcting telecentricity profile for each target region C of a substrate W based on information relating to the topology of the substrate W.

In some embodiments, information relating to each substrate W may be determined before it is clamped to one of the substrate tables WT1, WT2. When the substrate is clamped to one of the substrate tables WT1, WT2 in general it will become distorted. For embodiments wherein information relating to each substrate W is determined before it is clamped to one of the substrate tables WT1, WT2, the effects of clamping on the topography of the substrate W may be modelled such that the topology of the substrate during exposure within the lithographic apparatus can be estimated.

Figure 8:
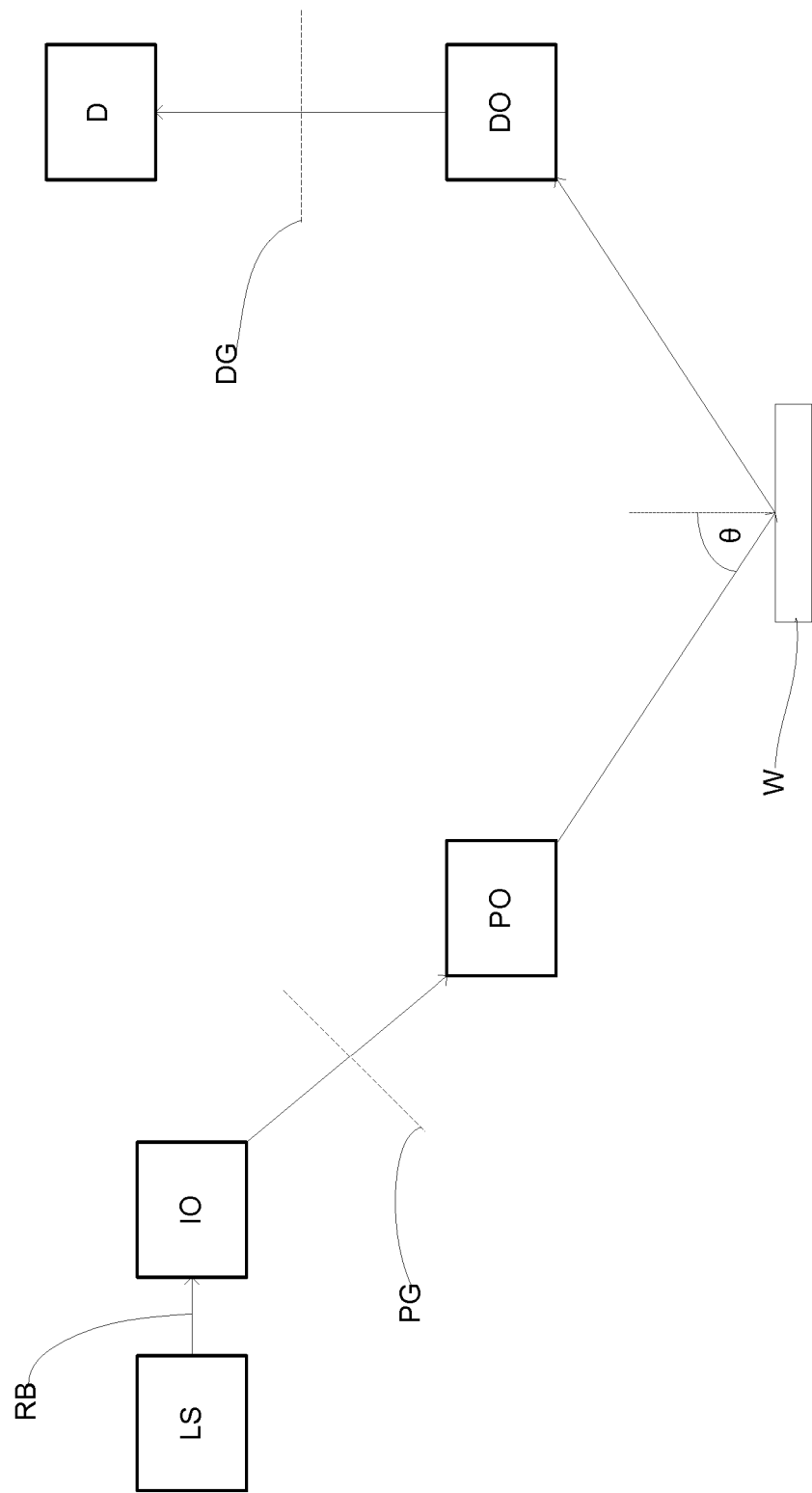
FIG. 8 is a schematic illustration of a topography measurement system that forms part of the lithographic apparatus of FIG. 1.

Alternatively, in some embodiments, the topology of the surface of each substrate W may be determined using the topography measurement system TMS, as now described. FIG. 8 is a schematic diagram of the topography measurement system TMS shown in FIG. 1A. Topography measurement system TMS comprises a radiation source LS, illumination optics IO, a projection grating PG, projection optics PO, detection optics DO, a detection grating DG and a detector D.

Radiation source LS is operable to produce a radiation beam RB, which is directed through illumination optics IO and a projection grating PG. The radiation beam RB may be considered to be patterned by the projection grating PG. The radiation beam subsequently passes through the projection optics PO, which are arranged to direct the radiation beam onto a target portion of the substrate W at an angle of incidence θ.

The radiation beam RB is reflected from the target portion (or "spot") of the substrate W and passes through detection optics DO. The detection optics DO directs the reflected radiation beam through the detection grating DG before being incident upon the detector D. The detector D is operable to detect the intensity of light incident upon it and produce a signal indicative thereof, which is received by the processor PR.

In order to determine the topography of the substrate W, the first substrate positioning device PW1 is used to move the substrate W such that the target portion of the substrate W that receives radiation beam RB changes. The first substrate positioning device PW1 may be operable to move the substrate W relative to the topography measurement system TMS in a manner similar to the motion of the substrate W relative to the projection system PL that is performed by the second substrate positioning device PW2.

The processor PR receives data from the alignment system AS and the topography measurement system TMS. The processor PR also receives substrate table WT1 position information from first substrate positioning device PW1. Since the substrate W is fixed to (typically via a clamp) the substrate table WT1, position information relating to the substrate table WT1 may be taken as being position information relating to the substrate W.

As the substrate W is scanned underneath the topography measurement system TMS, changes in the height of the substrate W result in the image of the projection grating PG shifting laterally relative to the detection grating DG. The amount of light transmitted by the detection grating DG (and therefore detected by detector D) is dependent upon the relative lateral position of the image of the projection grating PG and the detection grating DG. Therefore the signal received by the detector is dependent on the height of the substrate W. The signal output by the detector may be analyzed by the processor PR which is configured to determine the topography of the substrate W. This method of topography measurement may be referred to as "optical triangulation". The illumination optics IO, projection optics PO and detection optics DO may contain a variety of optical components such as, for example, lenses or mirrors.

Multiple radiation sources may be used to produce multiple radiation beams which may then pass through multiple illumination optics and illuminate multiple target portions of the substrate. Using multiple radiation beams allows the substrate W to be scanned in fewer strokes and its topography to be determined more quickly. In some embodiments, a plurality of target portions (or "spots") of the substrate W may be illuminated by the radiation beam. This plurality of spots may extend in a non-scanning direction of the substrate W and may, for example span a single target region C of the substrate (see FIG. 1B).

Processor PR may comprise a memory and may be operable to store information relating to the topography of the entire substrate W. The topography of the surface of a substrate W may be referred to as a wafer map.

The processor PR is operable to generate a correcting telecentricity profile for each target region C of a substrate W based on the wafer map.

During exposure of a substrate W (on the right-hand side of FIG. 1A) it is desirable to keep the substrate W in a focal plane of the projection system PL. In order to achieve this, the substrate table WT2 may be moved in the z direction, said movement of the substrate table WT2 being determined in dependence on the topography of the surface of a substrate W (as previously determined by the topography measurement system TMS). It may not be possible to keep all parts of the exposure region in the focal plane and the motion of the substrate table WT2 may be chosen so as to minimise the defocus across the entire exposure region.

While specific embodiments of the invention have been described above, it will be appreciated that the invention may be practiced otherwise than as described. The description is not intended to limit the invention.

The invention claimed is:

1. A lithography method comprising:
   determining a topology of a substrate within a target region; and
   projecting a radiation beam onto the target region of the substrate so as to form an image on the substrate, wherein the radiation beam is such that a net direction of total radiation received by a point in the target region of the substrate is chosen in dependence on the topology of the substrate so as to at least partially correct for an overlay error introduced by a curvature of a surface of the substrate at the point.

2. The method of claim 1, wherein the net direction of the total radiation received by the point in the target region of the substrate is chosen so that the radiation which is incident on the point passes through a corresponding point in a focal plane of a projection system that is used to project the radiation beam onto the target region of the substrate so as to form the image, the corresponding point in the focal plane being the point in the focal plane where the point on the substrate would be disposed if the surface of the substrate was deformed such that it was flat and coincided with the focal plane.

3. The method of claim 1, wherein the net direction of the total radiation received by the point in the target region is not perpendicular to the plane of the substrate.

4. The method of claim 1, further comprising:
   producing the radiation by adjusting intensity to attenuate the radiation beam on opposing sides of the radiation beam by using a plurality of movable fingers arranged in pairs, each pair comprising one finger on each side of the radiation beam, such that the net direction of the total radiation received by each point on the surface of the substrate is controlled by controlling the fingers of the intensity adjustor during exposure of those points.

5. The method of claim 1, further comprising:
   determining a correcting telecentricity profile based on the topology of the substrate within the target region, the correcting telecentricity profile describing variation in the net direction of the total radiation received by the point across the target region; and
   wherein the radiation beam is such that the net direction of the total radiation received by the point in the target region of the substrate is chosen in dependence on the correcting telecentricity.

6. The method of claim 1, wherein the net direction of the total radiation received by each point on the surface of the substrate varies across the exposure region.

7. The method of claim 6, wherein the projecting the radiation beam onto the target region of the substrate so as to form an image on the substrate comprises moving the substrate along a scanning path relative to the radiation beam such that the radiation beam scans across the target region so as to form the image.

8. The method of claim 7, wherein the net direction of the total radiation received by the surface of the substrate varies across the target region in a non-scanning direction.

9. The method of claim 7, wherein the net direction of the total radiation received by the surface of the substrate varies across the target region in the scanning direction.

10. The method of claim 1, further comprising:
    imparting the radiation beam with a pattern in its cross-section prior to projecting the radiation beam onto the target region of the substrate.

11. The method of claim 10, wherein the projecting the radiation beam onto the target region of the substrate so as to form an image on the substrate comprises moving the patterning device along a scanning path relative to the radiation beam such that the radiation beam scans across the patterning device.

12. The method of claim 1, wherein the substrate comprises a plurality of target regions,
    wherein the determining a topology of the substrate within the target region comprises determining a topology of the substrate within each of a plurality of target regions; and
    wherein the projecting the radiation beam onto the target region of the substrate so as to form an image on the substrate comprises sequentially projecting the radiation beam onto each target region of the substrate so as to form an image.

13. The method of claim 1, wherein the determining a topology of the substrate within a target region is performed before the substrate is clamped to a substrate table.

14. The method of claim 13, wherein the determining a topology of the substrate within a target region further comprises modeling effects of clamping the substrate to a substrate table on the topology of the substrate.

15. The method of claim 1, wherein the determining a topology of the substrate within a target region is performed after the substrate has been clamped to a substrate table.

16. The method of claim 11, wherein the determining a topology of the substrate within a target region comprises determining a height of the substrate at a plurality of points on the surface of the substrate.

17. The method of claim 16, comprising:
    projecting a radiation beam onto the plurality of points on the surface of the substrate, detecting radiation reflected from the substrate; and
    determining a height of the substrate from the detected reflected radiation.

18. A lithographic apparatus comprising:
    an illumination system configured to condition a radiation beam;
    a substrate table configured to hold a substrate;
    a projection system configured to project the patterned radiation beam onto a target region of the substrate so as to form an image on the substrate; and
    a controller operable to control a net direction of total radiation received by a point in the target region of the substrate, such that the net direction of the total radiation received by the point in the target region of the substrate is chosen so as to at least partially correct for an overlay error introduced by a curvature of a surface of the substrate at the point.

19. The lithographic apparatus of claim 18, wherein the controller is operable to implement one or more of:
    providing a substrate with a target region;
    determining a topology of the substrate within the target region;
    providing a radiation beam; and
    projecting the radiation beam onto the target region of the substrate so as to form an image on the substrate;
    wherein the radiation beam provided is such that a net direction of the total radiation received by the point in the target region of the substrate is chosen in dependence on the topology of the substrate so as to at least partially correct for an overlay error introduced by a curvature of a surface of the substrate at the point.

20. The lithographic apparatus of claim 18, wherein the controller comprises a processor operable to determine a correcting telecentricity based on a topology of the substrate within the target region.

* * * * *